United States Patent [19]

Jun et al.

[11] Patent Number: 4,459,348
[45] Date of Patent: Jul. 10, 1984

[54] MULTI-LAYER ELEMENTS SUITABLE FOR THE PRODUCTION OF PRINTING PLATES AND RELIEF PLATES

[75] Inventors: Mong-Jon Jun, Speyer; Peter Richter, Frankenthal; Helmut Barzynski, Bad Durkheim, all of Fed. Rep. of Germany

[73] Assignee: BASF Aktiengesellschaft, Fed. Rep. of Germany

[21] Appl. No.: 498,711

[22] Filed: May 27, 1983

Related U.S. Application Data

[63] Continuation-in-part of Ser. No. 337,302, Jan. 5, 1982, abandoned.

[30] Foreign Application Priority Data

Jan. 7, 1981 [DE] Fed. Rep. of Germany ....... 3100175

[51] Int. Cl.$^3$ ............................................... G03C 1/78
[52] U.S. Cl. .................................... 430/271; 430/300; 430/306; 430/905
[58] Field of Search .................. 430/271, 271 A, 300, 430/306, 905

[56] References Cited

U.S. PATENT DOCUMENTS 3,024,180 3/1962 McGraw .
3,036,913 5/1962 Burg .
3,674,486 7/1972 Milgrom .

FOREIGN PATENT DOCUMENTS 614181 2/1961 Canada .
2321 11/1978 European Pat. Off. .
2444118 9/1974 Fed. Rep. of Germany .

Primary Examiner—Jack P. Brammer
Attorney, Agent, or Firm—Keil & Weinkauf

[57] ABSTRACT

A multi-layer element for the production of printing plates and relief plates which is based on an elastomeric polymer binder and is firmly anchored to a polyester base by means of an adhesive layer. The adhesive layer consists of a thermally hardened mixture which is insoluble in aromatic hydrocarbon solvents or aliphatic halohydrocarbon solvents and contains (c1) from 90 to 40% by weight, based on the sum of (c1) and (c2), of an hydroxyl-containing polyurethane, hydroxyl-containing epoxy, hydroxyl-containing phenoxy resin, polyester-ol or polyether-ol resin which has been hardened and crosslinked with isocyanate, and which has from about 4 to 20% by weight, based on the non-crosslinked and hardenable resin, of free OH groups before hardening and crosslinking with isocyanate, and (c2) from 10 to 60% by weight, based on the sum of (c1) and (c2), of an OH-free polycarbonate which is compatible with the resin (c1) before the latter is hardened and crosslinked.

5 Claims, No Drawings

MULTI-LAYER ELEMENTS SUITABLE FOR THE PRODUCTION OF PRINTING PLATES AND RELIEF PLATES

This application is a continuation-in-part of copending application Ser. No. 337,302 which was filed on Jan. 5, 1982 now abandoned. This application incorporates by reference the disclosure of said copending application as well as the priority document filed in the Federal Republic of Germany under application No. P 31 00 175.0 on Jan. 7, 1981 which is referred to in copending application Ser. No. 337,302.

The present invention relates to multi-layer elements suitable for the production of printing plates and relief plates and containing a photopolymerizable and/or photo-crosslinkable layer which is based on an elastomeric polymer binder and is firmly anchored to a polyester base via an adhesive layer; the multi-layer elements possess improved stability in processing and use.

Multi-layer elements for the production of relief printing plates having elastomeric relief layers, as employed for flexographic printing, are known per se and are described, for example, in German Laid-Open Applications DOS No. 2,138,582, DOS No. 2,215,090, DOS No. 2,456,439, DOS No. 2,623,801 and DOS No. 2,942,183, in Canadian Pat. No. 614,181 and in U.S. Pat. Nos. 3,024,180 and 3,674,486. These multi-layer elements in general comprise a photopolymerizable and/or photo-crosslinkable layer of a mixture of an elastomer with a photopolymerizable monomer, this layer being firmly bonded to a dimensionally stable base, for example a plastic film or a sheet of metal. German Laid-Open Application DOS No. 2,444,118 describes a laminate for the production of relief printing plates which are suitable for flexographic printing and in which the relief-forming, photosensitive layer is firmly anchored to a dimensionally stable base, consisting, for example, of a polyester film, which in turn is bonded to a flexible and resilient lower layer. From the publications mentioned, it is also known that it is advantageous to use an intermediate adhesive layer to bond the photosensitive layer firmly to the dimensionally stable base. For such adhesive layers, the use of commercial one-component or two-component adhesives based on polyurethane or polychloroprene, for example, has been proposed. Furthermore, it has been recommended that mixtures of polymeric binders with polymerization initiators be used as the adhesive layer (cf. for example European Patent Application No. A2-0002321 and U.S. Pat. No. 3,036,913). Further, Swiss Pat. No. 421,708 discloses the preparation of a thin resilient photopolymerizable element comprising a relief-forming, photopolymerizable layer, a barrier layer and a hardenable adhesive layer on a resilient base, in particular a polyethylene terephthalate film, by a procedure in which a layer of the photopolymerizable composition consisting of a monomer and a compatible polymeric binder, as used for the preparation of the photopolymerizable relief-forming layers, is applied to the polyethylene terephthalate film provided with the hardenable adhesive layer and is partially crosslinked, and a layer of the photopolymerizable composition for the photopolymerizable relief-forming layer is then applied. The hardenable adhesive layer consists of a copolyester and a diisocyanate as the thermal hardener.

However, it has been found in practice that in multi-layer elements comprising a photosensitive layer based on an elastomeric polymer and a polyester film base, the photosensitive layer is, in use, inadequately anchored to the polyester film, even when conventional adhesive layers for these multi-layer elements are used. Thus, when exposed photopolymeric multi-layer elements of this type are washed out and also when photopolymeric printing plates and relief plates prepared from these elements are used, the photopolymeric elastomeric relief layer frequently becomes detached from the polyester film used as the base, in particular owing to the effect of the organic solvents used in printing, thereby making the printing plates or relief plates unusable.

It is an object of the present invention to provide photosensitive multi-layer elements which are suitable for the production of relief printing plates for flexographic printing, contain a photosensitive layer, based on an elastomeric polymer, firmly anchored to a polyester base, and exhibit improved adhesion between the photosensitive layer and the base during production, processing and use of these multi-layer elements.

We have found that this object is achieved and that multi-layer elements suitable for the production of printing plates and relief plates, and comprising (a) a photosensitive layer of a mixture which is soluble and/or dispersible in aromatic hydrocarbon solvents or aliphatic halohydrocarbon solvents and consists essentially of
   (a1) one or more elastomeric polymers as the binder,
   (a2) one or more photopolymerizable, ethylenically unsaturated monomers compatible with the binder, and
   (a3) a photopolymerization initiator activated by actinic light, with or without
   (a4) conventional additives,
(b) a sheet-like polyester shaped article as a dimensionally stable base for the photosensitive layer (a) and
(c) an adhesive layer, consisting of a thermally hardened adhesive containing a polyisocyanate, between the photosensitive layer (a) and the dimensionally stable base (b), possess the desired properties when the adhesive layer (c) is composed of a mixture which is insoluble in the aromatic hydrocarbon or aliphatic halohydrocarbon solvents and contains (c1) from 90 to 40% by weight, preferably from 90 to 70% by weight, based on the sum of (c1) and (c2), of a resin which has been hardened and crosslinked with isocyanate, and which has from about 4 to 20% by weight, based on non-crosslinked and hardenable resin, of free OH groups before hardening and crosslinking with isocyanate, and (c2) from 10 to 60% by weight, preferably from 10 to 30% by weight, based on the sum of (c1) and (c2), of an OH-free polycarbonate which is compatible with the resin (c1) before the latter is hardened and crosslinked.

The excellent bond between the photosensitive layer (c) and base (b) of the novel multi-layer elements is all the more surprising since corresponding multi-layer elements with closely similar adhesive layers do not exhibit this property. Thus, even when an adhesive consisting of a copolyester, an isocyanate and an epoxy resin and intended for use, as described in Example 14 of German Laid-Open Application DOS No. 2,215,090, as the adhesive layer in the production of multi-layer elements with a photopolymerizable layer and a metal base is employed, only unsatisfactory results are obtained with multi-layer elements possessing a polyester film as the base for the photopolymerizable layer. The novel multi-layer elements exhibit a strong adhesive joint not only before but also after exposure and development of the photosensitive layer, although the treatment of the layers with the developer and the possible resulting surface-swelling of the layer constituents are known to reduce the bond strength and to present particular problems in the production of firmly bonded laminates.

Examples of suitable mixtures for the photosensitive layer (a) which is soluble and/or dispersible in an aromatic hydrocarbon solvent or an aliphatic halohydrocarbon solvent and consists of (a1) one or more elastomeric polymers as the binder, (a2) one or more photopolymerizable, ethylenically unsaturated monomers compatible with the binder, and (a3) one or more photopolymerization initiators, with or without (a4) additives which improve the handling and/or processability, are those described in the publications mentioned at the outset, particularly German Laid-Open Applications DOS No. 2,138,582, DOS No. 2,215,090, DOS No. 2,456,439 and DOS No. 2,942,183. Elastomeric polymers which are soluble and/or can be swollen in an aromatic hydrocarbon solvent or an aliphatic halohydrocarbon solvent and are thus suitable as the binder (a1) are in particular the corresponding polymers of conjugated aliphatic dienes of 4 to 5 carbon atoms. Examples of these polymers are natural rubber, homopolymers of butadiene and isoprene, copolymers of butadiene and isoprene with one another, and copolymers of butadiene and/or isoprene with other copolymerizable monomers, in particular styrene, acrylonitrile, an alkyl acrylate or methacrylate where alkyl is of 1 to 8 carbon atoms, and others. Examples of such copolymers are nitrile rubbers (eg. butadiene/acrylonitrile copolymers containing from 20 to 35% by weight of acrylonitrile), copolymers of styrene with butadiene and/or isoprene which have a random distribution of the monomers and preferably contain from 10 to 50% by weight of styrene as copolymerized units, and block copolymers of styrene monomers with butadiene and/or isoprene. Particularly advantageous binders (a1) are two-block copolymers of the type A-B and three-block copolymers of the type A-B-A which contain one or two thermoplastic styrene polymer-blocks A, one elastomeric butadiene and/or isoprene polymer-block B and in general from 10 to 50% by weight of styrene as polymerized units, and elastomeric three-block copolymers of the type A-B-C which contain a thermoplastic, non-elastomeric styrene polymer-block A, an elastomeric butadiene and/or isoprene polymer-block B and an elastomeric polymer-block C which is different from B and consists of butadiene and/or isoprene, with or without styrene, such copolymers being used as binders, as described, for example, in German Laid-Open Application DOS No. 2,942,183.

Particularly important photopolymerizable, ethylenically unsaturated monomers (a2) compatible with the elastomeric binder (a1) are the esters of acrylic acid and/or methacrylic acid with monohydric or polyhydric alcohols. These esters include, among others, butyl acrylate, butyl methacrylate, 2-ethylhexyl acrylate, lauryl acrylate, lauryl methacrylate, ethylene glycol dimethacrylate, butane-1,4-diol diacrylate, butane-1,4-diol dimethacrylate, neopentyl glycol dimethacrylate, 3-methylpentanediol diacrylate, 2-hydroxypropyl acrylate, 2-hydroxyethyl acrylate, 2-hydroxyethyl methacrylate, hexane-1,6-diol diacrylate, hexane-1,6-diol dimethacrylate, 1,1,1-trimethylolpropane triacrylate, 1,1,1-trimethylolpropane trimethacrylate, di-, tri- and tetraethylene glycol diacrylate, tripropylene glycol diacrylate and pentaerythritol tetraacrylate. Vinyl esters of aliphatic monocarboxylic acids, such as vinyl oleate, and vinyl ethers of alcohols, such as octadecyl vinyl ether or butane-1,4-diol divinyl ether, are also suitable.

The photosensitive layer (a) contains in general from 60 to 95% by weight of the elastomeric binder (a1) and from 5 to 40% by weight of the photopolymerizable, ethylenically unsaturated monomer (a2).

The photosensitive layer (a) additionally contains an effective amount, in general from 0.01 to 10% by weight and in particular from 0.05 to 5% by weight, based on the components of the photosensitive layer (a), of one or more photopolymerization initiators, eg. benzoin or benzoin derivatives such as the methyl, isopropyl, n-butyl or isobutyl ether; symmetrically or unsymmetrically substituted benzil ketals, eg. benzil dimethyl ketal or benzil methyl ethyl ketal; or acylphosphine oxides of the type described, for example, in German Laid-Open Application DOS No. 2,909,992. The photosensitive layer (a) can also contain further additives, such as those conventionally used for improving the handling and processability of multi-layer elements of the type under discussion. These additives include in particular thermal polymerization inhibitors, eg. p-methoxyphenol, hydroquinone or salts of N-nitrosocyclohexylhydroxylamine, dyes, photochromic substances, antioxidants and/or plasticizers. The photosensitive layer (a) contains the additives in conventional amounts, and the total proportion of additives in the photosensitive layer (a) in general should not exceed 30% by weight, and is in particular from 5 to 20% by weight, based in each case on the sum of the components of the photosensitive layer (a).

In the novel multi-layer elements, the dimensionally stable base (b) for the photosensitive layer (a) is a sheet-like polyester shaped article, in particular a polyester film, for example of polyethylene terephthalate or polybutylene terephthalate. The polyester film employed as the dimensionally stable base (b) is in general from 50 to 300 μm thick, depending on the structure of the multi-layer element. To achieve better adhesion, the surface of the polyester film may be pre-treated mechanically or chemically, or, for example, by coating it with a thin layer, preferably from 2 to 25 μm thick, of a conventional one-component or multi-component adhesive, for example an adhesive based on polyurethane or polychloroprene.

According to the invention, the multi-layer element possesses, between the photosensitive layer (a) and the dimensionally stable base (b), a thin adhesive layer (c) for firmly bonding the former two layers, the adhesive layer (c) being composed of a mixture which is insoluble in aromatic hydrocarbon solvents or aliphatic halohydrocarbon solvents and contains (c1) from 90 to 40% by weight, in particular from 90 to 70% by weight, based on the adhesive layer (c), of a resin which has been hardened and crosslinked with isocyanate, and which has from about 4 to 20% by weight, preferably from 5 to 10% by weight, based on the hardenable and non-crosslinked resin, of free OH groups before hardening and crosslinking with isocyanate, and (c2) from 10 to 60% by weight, preferably from 10 to 30% by weight, based on the adhesive layer (c), of an OH-free polycarbonate which is compatible with the resin (c1) before the latter is hardened and crosslinked.

Accordingly, an intimate mixture of a resin containing free OH groups, an isocyanate component and an appropriate polycarbonate is used for preparing this adhesive layer.

Hydroxyl-containing polyurethane resins, polyester-ol resins and polyether-ol resins, in particular hydroxyl-containing epoxy resins, and, especially, hydroxyl-containing phenoxy resins are suitable as the hardenable resins with free OH groups for the preparation of the adhesive layer (c), which in general have molecular weights of from 500 to 50,000, preferably from 900 to 30,000.

Particularly advantageous hardenable resins for the preparation of the novel adhesive layer (c) are linear epoxy resins which are soluble in organic solvents, contain aromatic groups in the chain and have molecular weights of from 900 to 11,000, in particular from 2,500 to 10,000, and epoxide equivalents of from 0.15 to 0.01, preferably from 0.1 to 0.02, based on 100 g of resin, as well as phenoxy resins which have a similar structure and have molecular weights of from 10,000 to 50,000, preferably from 20,000 to 30,000, and contain no epoxy groups or only insignificant amounts of epoxy groups. These preferred epoxy resins or phenoxy resins contain in particular from 4 to 8% by weight, preferably from 5 to 7% by weight, based on the resin, of OH groups. Particularly suitable epoxy resins are the hydroxyl-containing products obtained from bisphenol A and epichlorohydrin, for example commercial epoxy resins, prepared from bisphenol A and epichlorohydrin, which have an epoxide equivalent of about 0.055 (based on 100 g of resin), contain 6.1% by weight of OH groups and have a molecular weight of 2,900, epoxy resins which are prepared from the same components, have an epoxide equivalent of about 0.03 (based on 100 g of resin), contain 6.8% by weight of OH groups and have a molecular weight of from 3,700 to 3,800, or commercial products of this type which have epoxide equivalents of from 0.02 to 0.04 (based on 100 g of resin), contain from 5.2 to 5.5% by weight of OH groups and have molecular weights of about 5,500–9,000. The linear polymeric diglycidyl ethers of bisphenol A which have recurring structural units of the formula

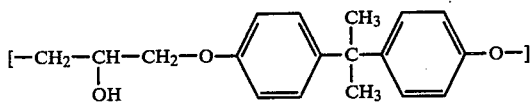

are typical examples of the preferred phenoxy resins.

In preparing the adhesive layer (c) from the hardenable resins containing free OH groups, the resins can be used individually or mixed with one another.

Isocyanate components suitable for hardening and crosslinking the above hardenable resins in the preparation of the adhesive layer (c) are the conventional diisocyanates and polyisocyanates known from polyurethane chemistry, preferably those having two or more aromatically bonded isocyanate groups. The following may be mentioned as examples: hexamethylene 1,6-diisocyanate, dicyclohexylmethane 4,4'-diisocyanate, isophorone diisocyanate, toluylene 2,4-diisocyanate, toluylene 2,6-diisocyanate, m-phenylene diisocyanate, xylylene diisocyanate, diphenylmethane 4,4'-diisocyanate, naphthylene 1,5-diisocyanate, 3,3'-dimethyldiphenyl 4,4'-diisocyanate, triphenylmethane 4,4',4''-triisocyanate and cyclohexyl-4-ene diisocyanate. The hydroxyl-containing resins are hardened by using from 0.8 to 1.6, in particular from 1.0 to 1.2, equivalents of CNO groups of the isocyanate per equivalent of free OH groups of the hardenable resin.

Suitable polycarbonates intended for use in adhesive layer (c) of the novel multi-layer elements are conventional, commercial polycarbonates which preferably no longer contain free OH groups and are compatible with the hardenable resin (c1) before it has been hardened. The molecular weight of the polycarbonates is in general from 25,000 to 75,000, preferably from 25,000 to 50,000. Polycarbonates, in particular soluble polycarbonates, obtained for example by reacting 4,4'-dihydroxydiphenyl alkanes, eg. 2,2-(4,4'-dihydroxydiphenyl)-propane or 4,4'-dihydroxydiphenylmethane, with phosgene or carbonic acid esters, are preferred.

The hardenable resin, the isocyanate and the polycarbonate are advantageously mixed, for preparing the novel adhesive layer (c), by dissolving the components together in a suitable solvent, for example tetrahydrofuran or a mixture of tetrahydrofuran with aromatic solvents, eg. xylene. In general, these solutions contain such an amount of solvent that a processing viscosity of about 200 mPa.s result at room temperature. The solution of adhesive-forming components is then applied in a conventional manner, for example by brushing, roller-coating, spraying or coating, to the polyester film used as the base (b). After the solvent has been allowed to evaporate off in the air, layer (c) is dried at elevated temperatures, under atmospheric or reduced pressure, and is baked. The thickness of the applied layer is advantageously so chosen that the hardened adhesive layer (c) is from 2 to 25 μm, in particular from 5 to 20 μm, thick after baking. Drying and baking, which hardens the adhesive layer (c), is usually carried out at from 80° to 200° C., in particular from 90° to 150° C., in general in the course of from 0.5 to 20 minutes, in particular in the course of from 0.5 to 5 minutes. The optimum temperature and period of heating for an adhesive layer depend on the components used. The adhesive layer (c) should preferably be hardened and crosslinked until it is insoluble, but can still be surface-swollen, in aromatic hydrocarbon solvents and/or aliphatic halohydrocarbon solvents. The components of adhesive layer (c) are advantageously so chosen that the layer is transparent after the hardening process, ie. drying and baking of the layer, and also remains transparent after treatment with solvents, for example, wash out of the exposed multi-layer elements. This transparency is advantageous in handling and using the multi-layer elements.

Pigments, pigmenting assistants, and other substances which advantageously affect the processing, for example conventional catalysts for accelerating the polyisocyanate hardening, can also be added to the mixtures of the components in the preparation of adhesive layer (c). It is often advantageous if the adhesive layer (c) contains antihalation dyes which absorb light of actinic wavelengths. This is particularly so when the photosensitive layer (a) of the multi-layer element is relatively thin. Layer (c) can contain the dyes in such amounts that up to 30% of the incident light is absorbed. The dyes contained in adhesive layer (c) must not be able to diffuse into the photosensitive layer (a) or to be extracted, for example by residual solvent in the photosensitive layer (a) or by the printing ink solvent. Examples of suitable dyes are those with reactive groups, which are fixed in adhesive layer (c) during the isocyanate hardening of the latter, for example Michlers ketone derivatives having 2 or more hydroxyl groups. Non-migrating dyes, eg. Zapon Fast Black (C.I. 12195, Solvent Black 34) or Auramin FA (C.I. 41000, Basic Yellow 2), are also suitable.

The novel multi-layer elements comprising a photosensitive layer (a) firmly bonded via a special adhesive layer (c) to a polyester film as the base (b) can be prepared in a conventional manner. Usually, the adhesive layer (c) is first applied, in the above manner, to the polyester film used as base (b), and the photosensitive layer (a) is then applied, for example by casting a solution of the components of layer (a) and evaporating off the solvent, to this assembly of hardened adhesive layer (c) and base (b). Naturally, the photosensitive layer (a) can also first be prepared separately, for example by casting from a solution or by extrusion, and this separate layer can then be laminated or pressed onto the assembly of hardened adhesive layer (c) and base (b). In the latter method, it can be advantageous to provide the hardened adhesive layer (c), before the photosensitive layer (a) is laminated on, with a thin top layer (about 5–50 $\mu$m thick) which has a composition which is the same as, or similar to, that of the photosensitive layer (a). This thin top layer is most advantageously produced by casting it from a solution of the components.

The novel multi-layer elements are particularly suitable for the production of printing plates and relief plates. These plates can be produced in a conventional manner by imagewise exposure of the photosensitive layer (a) using actinic light, preferably of wavelengths of from 230 to 450 nm, in particular from 300 to 420 nm, and then washing out the unexposed areas with a suitable developer, for example an aromatic hydrocarbon or an aliphatic halohydrocarbon. In general, the photosensitive layer (a) is from 200 to 7,000 $\mu$m thick. Since the novel multi-layer elements are used in particular for producing flexible and resilient printing plates, for example those used in flexographic printing, the relief layer (a) should have, in particular, a Shore A hardness (DIN 53,505) of from 15 to 70, after exposure and photo-crosslinking. The novel multi-layer elements are also suitable for the production of relief printing plates, for example those described in German Laid-Open Application DOS No. 2,444,118, where the base (b) for the relief-forming, photosensitive layer (a) is in turn additionally bonded to an elastomeric substrate and thus also serves as a stabilizing layer for the laminate. The printing plates and relief plates obtained exhibit excellent adhesion of the relief to the polyester base, even after repeated and prolonged treatment with solvents.

In the Examples which follow, parts and percentages are by weight, unless stated otherwise. Parts by weight bear the same relation to parts by volume as the kg to the liter.

EXAMPLE 1

A layer of a solution of 85 parts of an A-B-C block copolymer described in German Laid-Open Application DOS No. 2,942,183, 5 parts of hexane-1,6-diol diacrylate, 5 parts of hexanediol dimethacrylate, 1.3 parts of benzil dimethyl ketal, 0.4 part of 2,6-(di-tert.-butyl)-p-cresol and 0.006 part of a black eye (C.I. 26150, Solvent Balck 3) in toluene is cast onto a polyester film (cover sheet) coated with a 5 $\mu$m thick layer of polyvinylbutyral, and is then dried to give a photosensitive layer 1.7 mm thick.

A 10% strength solution of an adhesive in tetrahydrofuran is applied to a further polyester film and dried in a through-circulation cabinet dryer at 120° C. for 15 minutes; a 5 $\mu$m thick layer is obtained. The said solution is prepared by dissolving 75 parts of a phenoxy resin (PKHH of Union Carbide Corp.), 26 parts of a commercial polycarbonate (Makrolon 2800 of Bayer AG) and a stoichiometric amount of polyisocyanate (Desmodur L 75 of Bayer AG) in tetrahydrofuran. The free surface of the photosensitive layer is then applied to the surface of the hardened adhesive layer in a laminator.

The photosensitive layer is exposed for 2.5 minutes through the adhesive layer and for 20 minutes through the cover sheet in a commercial flat-plate exposure unit with 60 Watt UV tubes. The sample is cut into 2 cm wide strips, and the base film is bonded to metal strips with the aid of a double-sided adhesive tape. The adhesion is measured on an Instron tester, the exposed photolayer being peeled off vertically from the base film. The measured peel strengths are greater than 2.5 kp per 2 cm wide strip (30 mm/min peeling speed) and far greater than the tensile strength of the photo-cross-linked photosensitive layer itself.

A further sample of the multi-layer element is exposed on both sides as described above, washed out for 5 minutes in a commercial spray washer using a mixture of tetrachloroethylene/n-butanol (8:2 parts by volume), and dried in a cabinet dryer at 80° C. for 1 hour. The subsequent adhesion test, carried out as described above, shows no reduction in adhesion.

A further sample is exposed on both sides as described above and then immersed in a mixture of 7 parts by volume of ethanol and 3 parts by volume of ethyl acetate. After 6 hours' residence time, the adhesion of the sample is tested as above. The measured peel strengths are about 1.0 kp/2 cm for the interface between the adhesive layer and the photosensitive layer, and from 0.5 to 0.6 kp/2 cm for the interface between the adhesive layer and the polyester film.

EXAMPLE 2

To prepare a multi-layer printing plate, a 0.7 mm thick photosensitive layer, prepared as described in Example 5 of German Laid-Open Application DOS No. 2,942,183, is applied to a 75 $\mu$m thick polyester film adhered to a flexible and resilient substrate, prepared as described in German Laid-Open Application DOS No. 2,942,183, the polyester film having been coated, as described in Example 1, with a 5 $\mu$m thick layer of an adhesive consisting of a phenoxy resin (PKHH of Union Carbide Corp.), a polycarbonate (Makrolon 2800 of Bayer) and a polyisocyanate (Desmodur L of Bayer). The adhesive layer is hardened at 120° C. for 10 minutes. The adhesive contains a mixture of 4,4'-bis-(N-$\beta$-hydroxyethyl-N-methylamino)-benzophenone and Auramin FA (BASF, Basic Yellow 2), in the ratio 4:1, for antihalation purposes. The extinction of the 5 $\mu$m, thick adhesive layer is adjusted to be 0.30 at 360 nm.

In a series of exposure tests, the plates showed a wide exposure range, i.e. isolated image sections, such as 150 $\mu$m thick lines, are firmly supported on the polyester film and are firmly bonded to the latter. At the same time, the shadow dot wells are of good depth, so that crisp, clean printed copies are obtained. The adhesion test carried out as described in Example 1 gives similar results.

If such a multi-layer element is exposed through a photographic negative with screen rulings, lines and fine line work for 12 minutes, and is then developed in a commercial spray washer for 1 minute longer than the required washing-out time of 4 minutes, using a mixture of 8:2 parts by volume of tetrachloroethylene/n-butanol, the relief image shows no signs of detachment of lines from the base or distortion of lines. The relief image is a faithful reproduction of the original.

COMPARATIVE EXAMPLE

A multi-layer plate is prepared as described in Example 2, except that the adhesive layer consists of 100 parts of a phenoxy resin (PKHH of Union Carbide Corp.), 114.6 parts of a polyisocyanate (Desmodur L of Bayer) and the same antihalation mixture of 4,4'-bis-(N-$\beta$-hydroxyethyl-N-methylamino)-benzophenone and Auramin FA, with the same light absorption of E=0.3 at 360 nm at a thickness of 5 $\mu$m; thus, the layer does not contain any polycarbonate.

The adhesive is applied in the form of a solution in tetrahydrofuran, and dried at 120° C. for 10 minutes to give a 5-7 $\mu$m thick layer. The photosensitive layer is exposed for 12 minutes, as described in Example 2, through a photographic negative containing fine lines, screen rulings and line work, and is then washed out for 5 minutes using the same mixture as in Example 2. Particularly at their thinnest ends, the lines and screen rulings exhibit definite signs of detachment which are attributable to inadequate adhesion.

EXAMPLE 3

A multi-layer plate, as described in German Laid-Open Application DOS No. 2,942,183, is prepared from
(a) a photosensitive relief-forming layer consisting of 35 parts of an ABC block copolymer (block A: polystyrene, block B: polyisoprene and block C: styrene/butadiene copolymer; A:B:C=1:7.6:1.4), 5 parts of hexane-1,6-diol diacrylate, 5 parts of butane-1,4-diol dimethacrylate, 2 parts of trimethylolpropane triacrylate, 1.0 part of benzil dimethyl ketal, 0.5 part of 2,6-(di-tert.-butyl)-p-cresol, 0.006 part of a black dye (C.I. 26150, Solvent Black 3) and 5 parts of medicinal liquid paraffin; and
(b) a bottom layer consisting of 60 parts of the same block copolymer, 30 parts of liquid paraffin, 10 parts of hexane-1,6-diol dimethacrylate and 0.6 part of benzil dimethyl ketal.

A 75 $\mu$m thick polyester film is coated on both sides with a 10 $\mu$m thick adhesive layer consisting of 75 parts of a phenoxy resin, 25 parts of a polycarbonate and a stoichiometric amount of toluylene diisocyanate. The adhesive layer facing the relief layer is additionally colored with a non-extractable, relatively non-migratory dye (Zapon Fast Black, C.I. 12195, Solvent Black 34) and Michlers ketone for antihalation purposes. Before the relief-forming layer is laminated on, a further, 20 $\mu$m thick layer consisting of 90 parts of the ABC block copolymer of the relief-forming layer, 10 parts of hexane-1,6-diol dimethacrylate and 1.5 parts of benzil dimethyl ketal is applied to the hardened adhesive layer and pre-exposed for 130 seconds in a flat-plate exposure unit. The relief-forming layer (a) is then laminated onto the tacky surface. The adhesion of the unexposed layer is immediately so great that it cannot be peeled off without being torn. After exposure of the whole surface for 20 minutes, washing out for 4 minutes and drying at 80° C. for 1 hour, the peel strengths are >3 kg/2 cm, and the adhesive layer cannot be detached from the polyester film.

After the plates have been immersed in ethanol-containing printing ink for 6 hours, the adhesion has only decreased insignificantly, and no signs of delamination are found.

EXAMPLE 4

A multi-layer element having a photopolymerizable layer based on a styrene/butadiene two-block copolymer containing 30% of styrene is prepared in the following manner:

A 125 $\mu$m thick polyethylene terephthalate film is coated with a 5 $\mu$m layer of a polyurethane two-component adhesive. The layer is baked for 2 minutes at 120° C., and a 20 $\mu$m thick layer consisting of 75 parts of a polyamide (Ultramid 1C of BASF), 25 parts of bis-(N-methylolacrylamide)-glycol ether and 1.8 parts of benzil dimethyl ketal is applied as a solution in methanol/H$_2$O, dried, and pre-exposed for 60 seconds. A 10 $\mu$m thick adhesive layer consisting of 75 parts of a phenoxy resin (PKHH of Union Carbide Corp.), 25 parts of a polycarbonate and 86 parts of a polyisocyanate (Desmodur L of Bayer) is then applied and is hardened for 30 minutes at 140° C. A photosensitive layer which has a composition similar to that described in Example 3, except that the three-block copolymer is replaced by the above two-block copolymer, is applied by laminating and is then exposed.

The peel strength of the multi-layer element is greater than the tensile strength of the photopolymer layer, i.e. >3 kp in the case of 2 cm wide strips. After a sample has been exposed for 20 minutes and then immersed for 6 hours in ethanol/ethyl acetate (7:3 parts by weight), peel strengths of from 0.7 to 0.8 kg/2 cm wide strip are obtained.

EXAMPLE 5

An adhesive layer consisting of 75 parts of a phenoxy resin, a stoichiometric amount of a polyisocyanate, 25 parts of a polycarbonate, 7 parts of hexane-1,6-diol diacrylate, 4 parts of hexane-1,6-diol dimethacrylate, 1.2 parts of benzil dimethyl ketal and 0.24 part of a yellow dye (C.I. 41000, Basic Yellow 2) is applied to a polyester film. The 8 $\mu$m thick layer is baked for 2 minutes at 100° C., an intermediate layer is applied, as described in Example 3, and a relief-forming layer is then laminated on, as described in Example 3. The measured peel strengths are 2.5 kp/2 cm wide strips of material which has been exposed and washed out, and 0.3 kp/2 cm wide strips of exposed material which has been immersed for 6 hours in ethanol/ethyl acetate (7:3).

EXAMPLE 6

A photosensitive relief-forming layer consisting of 90 parts of an acrylonitrile/butadiene rubber containing 28% of acrylonitrile and having a Mooney viscosity of 40, 4 parts of hexane-1,6-diol diacrylate, 4 parts of hexane-1,6-diol dimethacrylate, 3 parts of trimethylolpropane triacrylate, 1.3 parts of benzil dimethyl ketal and 0.005 part of Sudan Deep Black (Solvent Black 3, C.I. 26150) is applied to an adhesive layer described in Example 2. After the 1.7 mm thick relief-forming layer has been exposed for 30 minutes and washed out in 1,1,1-trichloroethane for 5 minutes, the measured peel strength is 2.2 kg/2 cm wide strip.

We claim:

1. A multi-layer element, suitable for the production of printing plates and relief plates, which comprises
   (a) a photosensitive layer of a mixture which is soluble and/or dispersible in aromatic hydrocarbon solvents or aliphatic halohydrocarbon solvents and consists essentially of
   (a1) at least one elastomeric polymer as the binder,
   (a2) at least one photopolymerizable, ethylenically unsaturated monomer compatible with the binder, and
   (a3) a photopolymerization initiator which is activated by actinic light, with or without
   (a4) conventional additives,
   (b) a sheet-like polyester shaped article as the dimensionally stable base for the photosensitive layer (a) and
   (c) a thin adhesive layer, between the layer (a) and base (b), consisting of a thermally hardened mixture which is insoluble in the aromatic hydrocarbon solvents or aliphatic halohydrocarbon solvents and contains
   (c1) from 90 to 40% by weight, based on the sum of (c1) and (c2), of an hydroxyl-containing polyurethane, an hydroxyl-containing epoxy resin, an hydroxyl-containing phenoxy resin, polyester-ol or polyether-ol resin which has been hardended and crosslinked with isocyanate, and which has from about 4 to 20% by weight, based on the non-crosslinked and hardenable resin, of free OH groups before hardening and crosslinking with isocyanate, and
   (c2) from 10 to 60% by weight, based on the sum of (c1) and (c2), of an OH-free polycarbonate which is compatible with the resin (c1) before the latter is hardened and crosslinked.

2. A multi-layer element as set forth in claim 1, wherein the adhesive layer (c) additionally contains a dye.

3. A multi-layer element as set forth in claim 1, containing, as the base (b), a polyester film which may have been pre-treated mechanically, chemically and/or by providing it with an adhesive coating.

4. A multi-layer element as set forth in claim 1, wherein the resin of c1 is an hydroxyl-containing epoxy resin.

5. A multi-layer element as set forth in claim 1, wherein the resin of c1 is an hydroxyl-containing phenoxy resin.

* * * * *